United States Patent
Wendell et al.

[19]

[11] Patent Number: 5,959,468
[45] Date of Patent: Sep. 28, 1999

[54] BUFFER FOR STATIC IN/STATIC OUT DYNAMIC SPEED

[75] Inventors: Dennis L. Wendell, Pleasanton; Effendy Kumala, San Jose, both of Calif.

[73] Assignee: Advanced Micro Devices, Inc., Sunnyvale, Calif.

[21] Appl. No.: 08/938,131

[22] Filed: Sep. 26, 1997

[51] Int. Cl.⁶ ............................................. H03K 19/0175
[52] U.S. Cl. ................................. 326/83; 326/93; 326/98
[58] Field of Search ................................ 326/83, 86, 121, 326/95, 98, 93, 82

[56] References Cited

U.S. PATENT DOCUMENTS

| | | |
|---|---|---|
| 4,987,324 | 1/1991 | Wong et al. . |
| 5,117,133 | 5/1992 | Luebs ........................................ 326/98 |
| 5,134,316 | 7/1992 | Ta . |
| 5,241,502 | 8/1993 | Lee et al. ................................. 365/203 |
| 5,355,029 | 10/1994 | Houghton et al. . |
| 5,430,399 | 7/1995 | Wendell .................................. 326/121 |
| 5,448,181 | 9/1995 | Chiang ..................................... 326/27 |
| 5,495,188 | 2/1996 | Chen et al. ............................... 326/93 |
| 5,550,487 | 8/1996 | Lyon ........................................ 326/33 |
| 5,650,733 | 7/1997 | Covino ..................................... 326/24 |
| 5,654,652 | 8/1997 | Raza et al. ................................ 327/17 |
| 5,708,374 | 1/1998 | Durham et al. .......................... 326/98 |
| 5,852,373 | 12/1998 | Chu et al. ................................ 326/98 |

*Primary Examiner*—Jon Santamauro
*Attorney, Agent, or Firm*—Skjerven, Morrill, MacPherson, Franklin & Friel LLP; Ken J. Koestner

[57] ABSTRACT

CMOS logic is coupled to dynamic logic which in turn is coupled to CMOS logic such than a clock is not required for the dynamic logic. Such a mixed static/dynamic buffer provides increased speed and fan-out. A buffer includes a dynamic circuit block coupled between static input and output blocks. The dynamic circuit block receives static true and complement input signals and provides dynamic output control signals responsive thereto. The dynamic circuit block dynamically changes the dynamic output control signals responsive to detecting a transition of the true input signal. The dynamic circuit block does not receive a clock signal. The static output block receives the dynamic output control signals and provides a static output signal responsive thereto. The static input block receives the true input signal and precharges the dynamic circuit block after the dynamic circuit block dynamically changes the dynamic output control signals.

32 Claims, 7 Drawing Sheets

BUFFER FOR STATIC IN/STATIC OUT DYNAMIC SPEED

BACKGROUND OF THE INVENTION

1. Field of the Invention

The present invention relates to electronic circuits, and, more particularly, to buffers in digital electronic circuits.

2. Description of the Related Art

Generally, semi-conductor memory devices include a data output buffer which has large current driving capability to increase fan-out of data output to terminals connected thereto. A typical data output buffer includes pull-up devices and pull-down devices connected in series between a supply voltage line and a ground line. Such a data output buffer applies a supply voltage to a data output terminal connected to the node of the data output buffer through the pull-up device for outputting a high level of data output. And the data output buffer couples ground potential to a data output terminal connected to the node of the data output buffer through a pull-down device for outputting a low level of data output is outputted.

Integrated CMOS logic circuits exist in two basic varieties: static and dynamic CMOS field-effect transistor ("FET") logic gates. Both varieties have at least one input and at least one output. A static CMOS logic gate typically requires no external clock signal to control its operation. Moreover, the static CMOS logic gate can preserve its state for as long as the power supply is applied to it. A dynamic CMOS logic gate, on the other hand, typically does not hold its state indefinitely and requires an external clock signal for its operation. The external clock defines alternating periods of precharging and evaluating the logic gate. Static CMOS circuits, on the other hand, evaluate and then hold the state until the next cycle.

Each of these circuit families has its own advantages and disadvantages. Dynamic circuits are fast, but they are also susceptible to noise. Static circuits are slower than dynamic circuits, but they typically have greater noise immunity and prevention of signal dissipation by strongly holding the output to a power rail voltage. It would be desirable to combine the benefits of these different circuit families without also incorporating their disadvantages.

SUMMARY OF THE INVENTION

It has been discovered that CMOS logic may be coupled to dynamic logic which in turn may be coupled to CMOS logic such than a clock is not required for the dynamic logic. Such a configuration provides increased speed over standard CMOS logic. For example, a CMOS-dynamic-CMOS buffer has a faster response to signal transitions than standard all-CMOS buffers. Furthermore, such a configuration allows for increased fan-out. For example, for a given load, fewer dynamic stages are required than with standard CMOS, or the same number of stages can fan-out to a larger load.

In one embodiment of the invention, a buffer includes a dynamic circuit block, a static input block and a static output block. The dynamic circuit block receives static true and complement input signals and provides dynamic output control signals responsive thereto. The dynamic circuit block dynamically changes the dynamic output control signals responsive to detecting a transition of the true input signal. The dynamic circuit block does not receive a clock signal. The static output block is coupled to receive the dynamic output control signals from the dynamic circuit block. The static output block provides a static output signal responsive to receiving the dynamic output control signals such that the static output signal has a logical value the same as a logical value of the true input signal after the dynamic circuit block dynamically changes the dynamic output control signals. The static input block is coupled to receive the true input signal. The static input block precharges the dynamic circuit block after the dynamic circuit block dynamically changes the dynamic output control signals.

In another embodiment, an integrated circuit chip includes a dynamic circuit block, a static input block and a static output block. The dynamic circuit block receives static true and complement input signals and provides dynamic output control signals responsive thereto. The dynamic circuit block dynamically changes the dynamic output control signals responsive to detecting a transition of the true input signal. The dynamic circuit block does not receive a clock signal. The static output block is coupled to receive the dynamic output control signals from the dynamic circuit block. The static output block provides a static output signal responsive to receiving the dynamic output control signals such that the static output signal has a logical value the same as a logical value of the true input signal after the dynamic circuit block dynamically changes the dynamic output control signals. The static input block is coupled to receive the true input signal. The static input block precharges the dynamic circuit block after the dynamic circuit block dynamically changes the dynamic output control signals.

In a further embodiment, the above described integrated circuit chip includes an integrated circuit microprocessor chip. The microprocessor chip further includes an execution engine, and instruction processing unit, and a cache memory coupled to the instruction processing unit.

In another further embodiment, the above described integrated circuit chip includes a memory chip. The memory chip includes the dynamic circuit block, the static output block and the static input block in an output buffer.

In another further embodiment, the above described integrated circuit chip is coupled into a computer system having a processor, a memory and a bus coupled therebetween. The integrated circuit chip includes circuits of at least one of the processor and the memory.

In another embodiment, a method for buffering static electronic signals in a mixed static/dynamic buffer includes receiving a static input signal at a first input of the buffer; generating a dynamic control signal by a dynamic stage of the buffer, the dynamic control signal having a first edge responsive to a transition of the first static signal; generating a static output signal by a static stage of the buffer, the static output signal being generated responsive to the first edge of the dynamic control signal; generating a precharge signal by the buffer, the precharge signal having a first edge after a predetermined delay from the transition of the static input signal; and generating a second edge on the dynamic control signal by the dynamic stage of the buffer responsive to the first edge of the precharge signal.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

FIGS. 3A and 3B are referred to collectively as FIG. 3.

FIGS. 4A and 4B are referred to collectively as FIG. 4.

DETAILED DESCRIPTION

The following sets forth a detailed description of a preferred embodiment of the invention. The description is intended to be illustrative of the invention and should not be taken to be limiting. Many variations, modifications, additions, and improvements may fall within the scope of the invention as defined in the claims that follow.

In one embodiment of the invention, a buffer includes a static input stage, a dynamic block including a plurality of dynamic stages, and a static output stage. A data signal is input to the static input stage and the dynamic block. A transition of the data signal propagates through the plurality of dynamic stages and is output to the static output stage. The number of dynamic and static stages determines the fan-out of the buffer. The static input stage derives recovery signals from the data signal to restore the stages of the dynamic block to a precharge state after the data signal transition propagates through the buffer.

Figure 1:
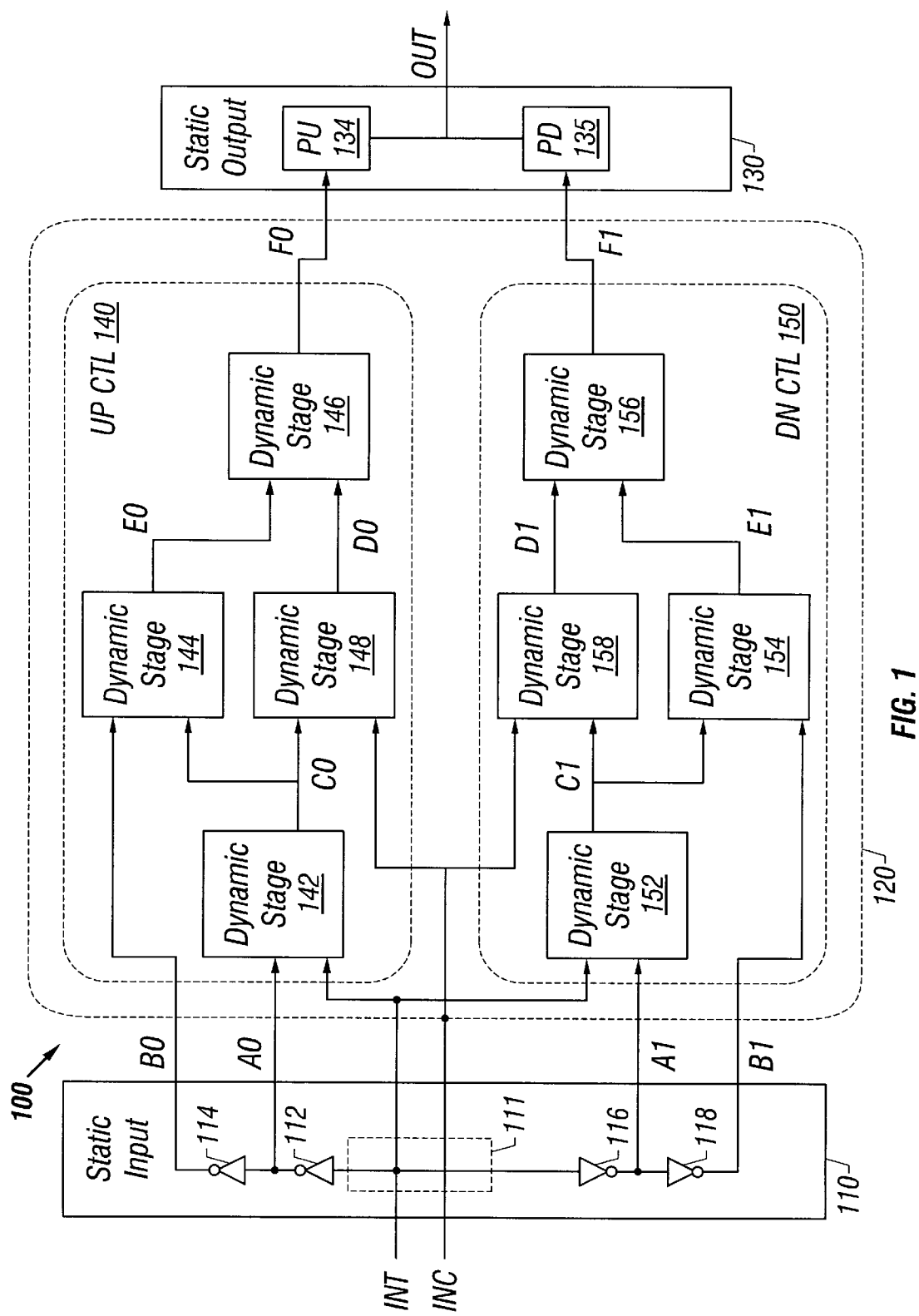
FIG. 1 is a block diagram of an output buffer according to an embodiment of the invention.

Referring to the embodiment of FIG. 1, buffer 100 includes static input stage 110, dynamic circuit block 120 and static output stage 130. Static input stage 110 is coupled to receive static input signal INT, and drives static outputs A0, B0, A1 and B1 to dynamic block 120. Dynamic block 120 receives the static signals INT, INC, A0, B0, A1 and B1, and drives dynamic outputs F0 and F1 to static output stage 130. Static output stage 130 receives dynamic outputs F0 and F1 and drives static output signal OUT.

Static input stage 110 includes input circuit 111. In the embodiment of FIG. 1, input circuit 111 receives and transfers true and complement signals INT and INC. Thus, in its simplest form, input circuit 111 includes wires to transport the input signals and has no effect on the logical value of signals INT and INC. In other embodiments, input circuit 111 may be eliminated as a conceptual logical block so that static input stage 110 receives only signal INT and dynamic block 120 receives true and complement signals INT and INC. In another embodiment, input circuit 111 is a CMOS inverter which receives signal INT and generates therefrom the complement signal INC. Thus, static input stage 110 may receive true and complement inputs or single-ended inputs depending on the type of input circuit 111 included. The input signals received by static input stage 110 are generated by logic without static hazards.

Static input stage 110 includes inverters 112, 114, 116 and 118. Inverters 112 and 116 receive static input signal INT and drive static output signals A0 and A1, respectively. Inverters 114 and 118 receive signals A0 and A1 and drive static output signals B0 and B1, respectively. Signals A0 and A1 are delayed complements of INT. Signals B0 and B1 are delayed complements of A0 and A1, respectively. Static input stage 110 drives static output signals A0, A1, B0 and B1 to dynamic block 120. Signals A0, A1, B0 and B1 are recovery signals for restoring dynamic circuitry in dynamic block 120 to a precharged state after a transition of INT causes a change in the dynamic outputs F0 and F1.

Static output stage 130 drives static output signal OUT to a particular logic value depending on the control signals received from dynamic block 120. In the embodiment of FIG. 1, static output stage 130 includes a standard static CMOS circuit including a pull-up circuit 134 and a pull-down circuit 135. As in a typical static CMOS circuit, OUT is driven between first and second values by being coupled to first and second power rails respectively and alternatively by pull-up and pull-down circuits 134, 135. Pull-up circuit 134 pulls node OUT up to a high logic value when pull-up circuit 134 is activated to couple OUT to $V_{DD}$, and pull-down circuit 135 pulls node OUT down to a low logic value when pull-down circuit 135 is activated to couple OUT to ground. Preferably, the CMOS circuit disconnects the first power rail (e.g., $V_{DD}$) before connecting the second power rail (e.g., ground) to node OUT to drive OUT to the second value (e.g., low or 0), and disconnects the second power rail before connecting the first power rail to node OUT to drive OUT to the first value (e.g., high or 1).

Dynamic block 120 includes up control circuit 140 and down control circuit 150. Up control circuit 140 drives up control signal F0 to pull-up circuit 134 of static output stage 130, and down control circuit 150 drives down control signal F1 to pull-down circuit 135 of static output stage 130. Up control signal F0 determines when pull-up circuit 134 is activated, and down control signal F1 determines when pull-up circuit 135 is activated. For example, pull-up circuit 134 may consist of a PMOS transistor having a gate coupled to receive up control signal F0, a drain coupled to $V_{DD}$, and a source coupled to node OUT. When up control signal F0 is low, the PMOS transistor of pull-up circuit 134 turns on and OUT is driven high to $V_{DD}$. Similarly, pull-down circuit 135 may consist of an NMOS transistor having a gate coupled to receive down control signal F1, a drain coupled to node OUT, and a source coupled to ground. When down control signal F1 is high, the NMOS transistor of pull-down circuit 135 turns on and OUT is driven low to ground. (See, e.g., FIG. 2.)

Referring again to FIG. 1, dynamic block 120 includes dynamic stages 142, 144, 146, 148, 152, 154, 156 and 158. The number of dynamic stages determines the fan-out of buffer 100. For example, in some embodiments, more than three dynamic stages may be required to generate the required fan-out for buffer 100. In other embodiments, fewer dynamic stages may be required. Buffer 100 provides higher fan-out than a static buffer having the same number of stages. Buffer 100 provides a required fan-out in fewer stages than a static buffer that provides the same fan-out.

Dynamic block 120 includes up control circuit 140 and down control circuit 150. Up control circuit 140 includes dynamic stages 142, 144, 146 and 148 and down control circuit 150 includes dynamic stages 152, 154, 156 and 158. Dynamic stage 142 has inputs coupled to nodes INT and A0, and an output coupled to node C0. Dynamic stage 144 has inputs coupled to nodes B0 and C0, and an output coupled to node E0. Dynamic stage 148 has inputs coupled nodes INC and C0, and an output coupled to node D0. Dynamic stage 146 has inputs coupled to nodes D0 and E0, and an output coupled to node F0. Dynamic stage 152 has inputs coupled to nodes INT and A1, and an output coupled to node C1. Dynamic stage 154 has inputs coupled to nodes B1 and C1, and an output coupled to node E1. Dynamic stage 158 has inputs coupled nodes INC and C1, and an output coupled to node D1. Dynamic stage 156 has inputs coupled to nodes D1 and E1, and an output coupled to node F1. (As used herein, the names of nodes are also used to identify the signals carried on the referenced nodes.)

Figure 3A:
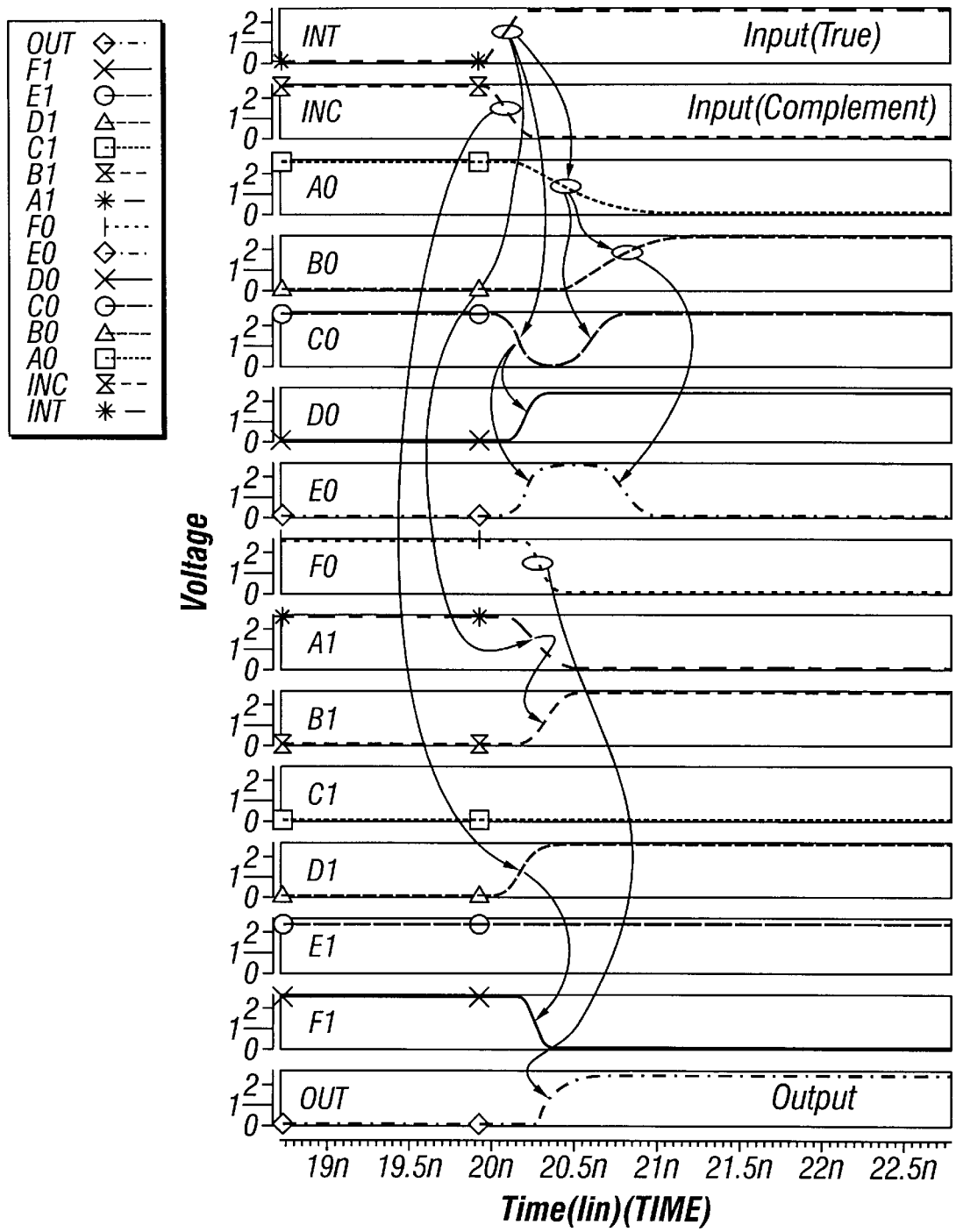
FIGS. 3A is a timing diagram showing the operation of an output buffer during a low-to-high data input transition according to an embodiment of the invention.
Figure 3B:
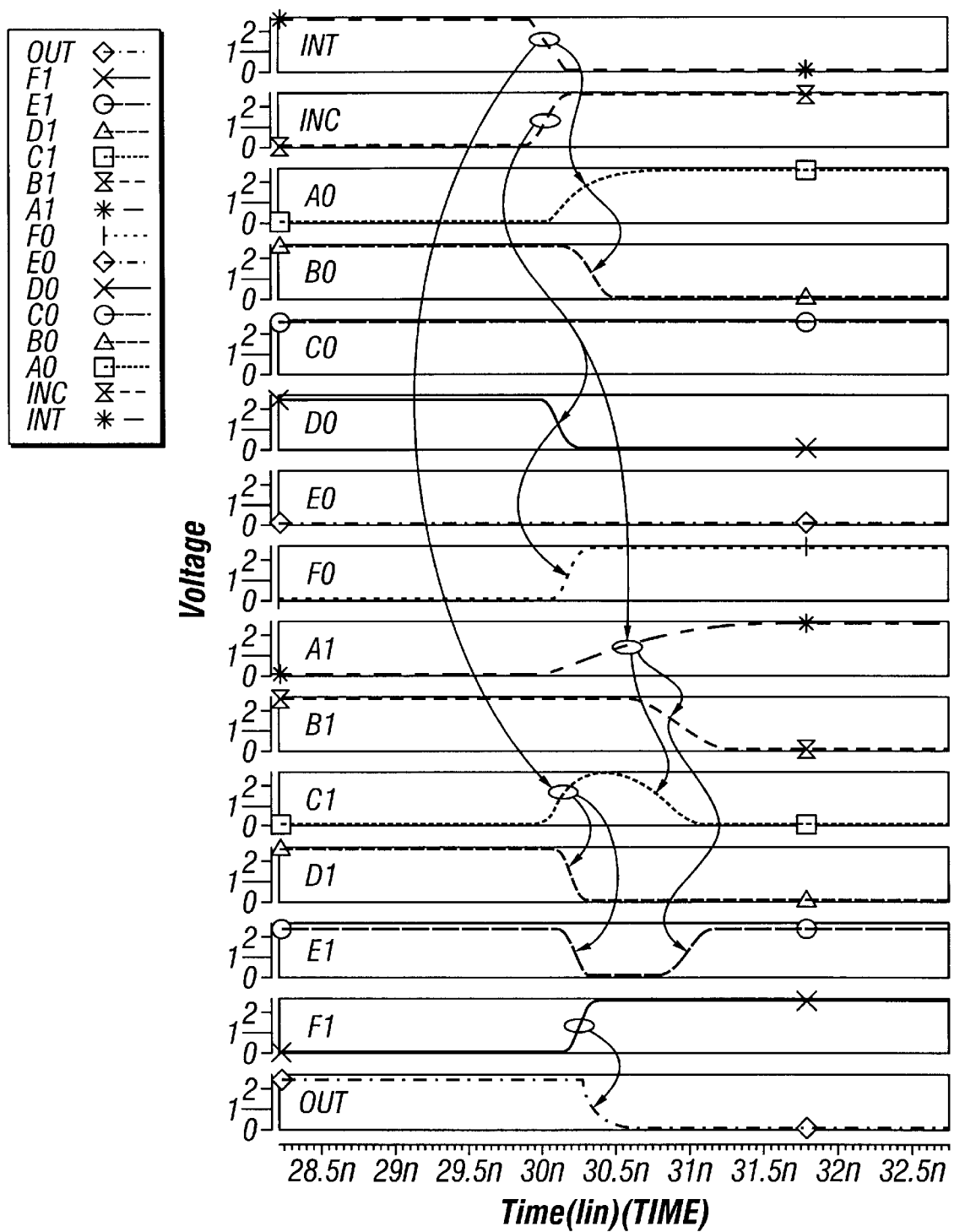
FIG. 3B is a timing diagram showing the operation of an output buffer during a high-to-low data input transition according to an embodiment of the invention.

Referring to FIGS. 1 and 3-4, dynamic stage 142 receives signals INT and A0 and generates signal C0. Signal C0 is a pulse having first and second edges and is derived from signals INT and A0. The first edge of signal C0 is derived from a transition of signal INT. The second edge of signal C0 is derived from a transition of signal A0. The transition of signal A0 occurs after the transition of INT because signal A0 is a delayed complement of signal INT. Therefore, signal C0 has a first edge responsive to a transition of signal INT, a later second edge responsive to a transition of signal A0, and a resulting pulse width determined by the delay introduced by inverter 112. Dynamic stages 144 and 148 transition signals E0 and D0, respectively, responsive to the first edge of C0. In the preferred embodiment, C0 is a low-active pulse responsive to a low-to-high transition of INT which precharges node D0 and discharges node E0. C0 is high during all other times.

Dynamic stage 144 receives signals B0 and C0 and generates signal E0 therefrom. Dynamic stage 144 causes signal E0 to transition from a first value to a second value responsive to receiving the first edge of signal C0, thereby generating a first edge of signal E0. The signal B0 is delayed by inverters 112 and 114 so that a first edge of B0 is received at dynamic stage 144 after the first edge of C0. Dynamic stage 144 uses the first edge of signal B0 to reset signal E0 from the second value back to the first value, thereby generating a second edge of signal E0. Thus, E0 is a pulsed signal having a width at least partially determined by the time delay between the first edge of signal C0 and the transition of B0.

Dynamic stage 148 receives signals INC and C0 and generates signal D0 therefrom. Dynamic stage 148 holds signal D0 at a first value while INC is at a first value. Dynamic stage 148 pulls signal D0 to a second value when INC transitions to a second value and responsive to receiving the first edge of signal C0. Thus, the transition of signal D0 is a double-driven transition from the first value to the second value.

Dynamic stage 146 receives signals D0 and E0 and generates signal F0 therefrom. Dynamic stage 146 holds signal F0 at a first value while D0 is at a first value. Dynamic stage 146 pulls signal F0 to a second value when D0 transitions to a second value and responsive to receiving the first edge of signal E0. The transition of signal F0 is a double-driven transition from the first value to the second value.

Dynamic stage 152 receives signals INT and A1 and generates signal C1. Signal C1 is a pulse having first and second edges and is derived from signals INT and A1. The first edge of signal C1 is derived from a transition of signal INT. The second edge of signal C1 is derived from a transition of signal A1. The transition of signal A1 occurs after the transition of INT because signal A1 is a delayed complement of signal INT. Therefore, signal C1 has a first edge responsive to a transition of signal INT, a later second edge responsive to a transition of signal A1, and a resulting pulse width determined by the delay introduced by inverter 116. Dynamic stages 154 and 158 transition signals E1 and D1, respectively, responsive to the first edge of C1. In the preferred embodiment, C1 is a high-active pulse responsive to a low-to-high transition of INT which precharges node D1 and discharges node E1. C1 is low during all other times.

Dynamic stage 154 receives signals B1 and C1 and generates signal E1 therefrom. Dynamic stage 154 causes signal E1 to transition from a first value to a second value responsive to receiving the first edge of signal C1, thereby generating a first edge of signal E1. The signal B1 is delayed by inverters 116 and 118 so that a first edge of B1 is received at dynamic stage 154 after the first edge of C1. Dynamic stage 154 uses the first edge of signal B1 to reset signal E1 from the second value back to the first value, thereby generating a second edge of signal E1. Thus, E1 is a pulsed signal having a width at least partially determined by the time delay between the first edge of signal C1 and the transition of B1.

Dynamic stage 158 receives signals INC and C1 and generates signal D1 therefrom. Dynamic stage 158 holds signal D1 at a first value while INC is at a first value. Dynamic stage 158 pulls signal D1 to a second value when INC transitions to a second value and responsive to receiving the first edge of signal C1. Thus, the transition of signal D1 is a double-driven transition from the first value to the second value.

Dynamic stage 156 receives signals D1 and E1 and generates signal F1 therefrom. Dynamic stage 156 holds signal F1 at a first value while D1 is at a first value. Dynamic stage 156 pulls signal F1 to a second value when D1 transitions to a second value and responsive to receiving the first edge of signal E1. The transition of signal F1 is a double-driven transition from the first value to the second value.

Dynamic stages 142, 144 and 146 provide an on-path for pull-up circuit 134, and, in the alternative, dynamic stages 148 and 146 provide an off path for pull-up circuit 134. Similarly, dynamic stages 152, 154 and 156 provide an on-path for pulldown circuit 135, and, in the alternative, dynamic stages 158 and 156 provide an off path for pull-down circuit 134. That is, when input signal INT makes a first transition, an on path in one of the control circuits 140, 150 activates one of the static pull circuits 134, 135, and an off path in the other of the control circuits 140, 150 deactivates the other of the static pull circuits 134, 135.

For example, in the embodiment of FIG. 1, when INT transitions from low to high, the on path of up control circuit 140 is activated as is the off path of down control circuit 150. In this way, pull-up circuit 134 is turned on and pull-down circuit 135 is turned off, thereby driving OUT high. Also, when INT transitions from high to low, the off path of up control circuit 140 is activated as is the on path of down control circuit 150. In this way, pull-up circuit 134 is turned off and pull-down circuit 135 is turned on, thereby driving OUT low.

The off path of down control circuit 150 has a shorter propagation delay than the on path of up control circuit 140 to prevent crowbar current resulting from simultaneous activation of both pull-up and pull-down circuits 134, 135 on a low-to-high transition of INT. Also, the off path of up control circuit 140 has a shorter propagation delay than the on path of down control circuit 150 to prevent crowbar current resulting from simultaneous activation of both pull-up and pull-down circuits 134, 135 on a high-to-low transition of INT.

Conceptually, when INT transitions from low to high, the off path consists of input INC, dynamic stage 158, node D1, dynamic stage 156, node F1 and pull-down circuit 135. When INC transitions from high to low, the transition sets node D1 to a predetermined value (e.g., 1) via dynamic stage 158. The value of the signal on node D1 sets node F1 via dynamic stage 156 to turn off pull-down circuit 135. In the present example, the on path consists of input INT, nodes C0, E0 and F0 (and the dynamic stages therebetween), and pull-up circuit 134. When INT transitions from low to high, node C0 is initially set by dynamic stage 142 to a predetermined value (e.g., 0). Node C0 initially sets node E0 via dynamic stage 144 which sets node F0 via dynamic stage 146 to turn on pull-up circuit 134. After the transition at OUT is complete, recover signal A0 resets dynamic stage 142 and node C0, and recover signal B0 resets dynamic stage 144 and node E0.

Similarly, when INT transitions from high to low, the off path consists of input INC, nodes D0 and F0 (and the dynamic stages therebetween), and pull-up circuit 134. When INC transitions from low to high, node D0 sets node F0 via dynamic stage 146 to turn off pull-up circuit 134. The on path consists of input INT, nodes C1, E1 and F1 (and the dynamic stages therebetween), and pull-down circuit 135. When INT transitions from high to low, node C1 initially sets node E1 via dynamic stage 154 which initially sets node F1 via dynamic stage 156 to turn on pull-down circuit 135. After the transition at OUT is complete, recover signal A1 resets dynamic stage 152 and node C1, and recover signal B1 resets dynamic stage 154 and node E1.

Figure 2:
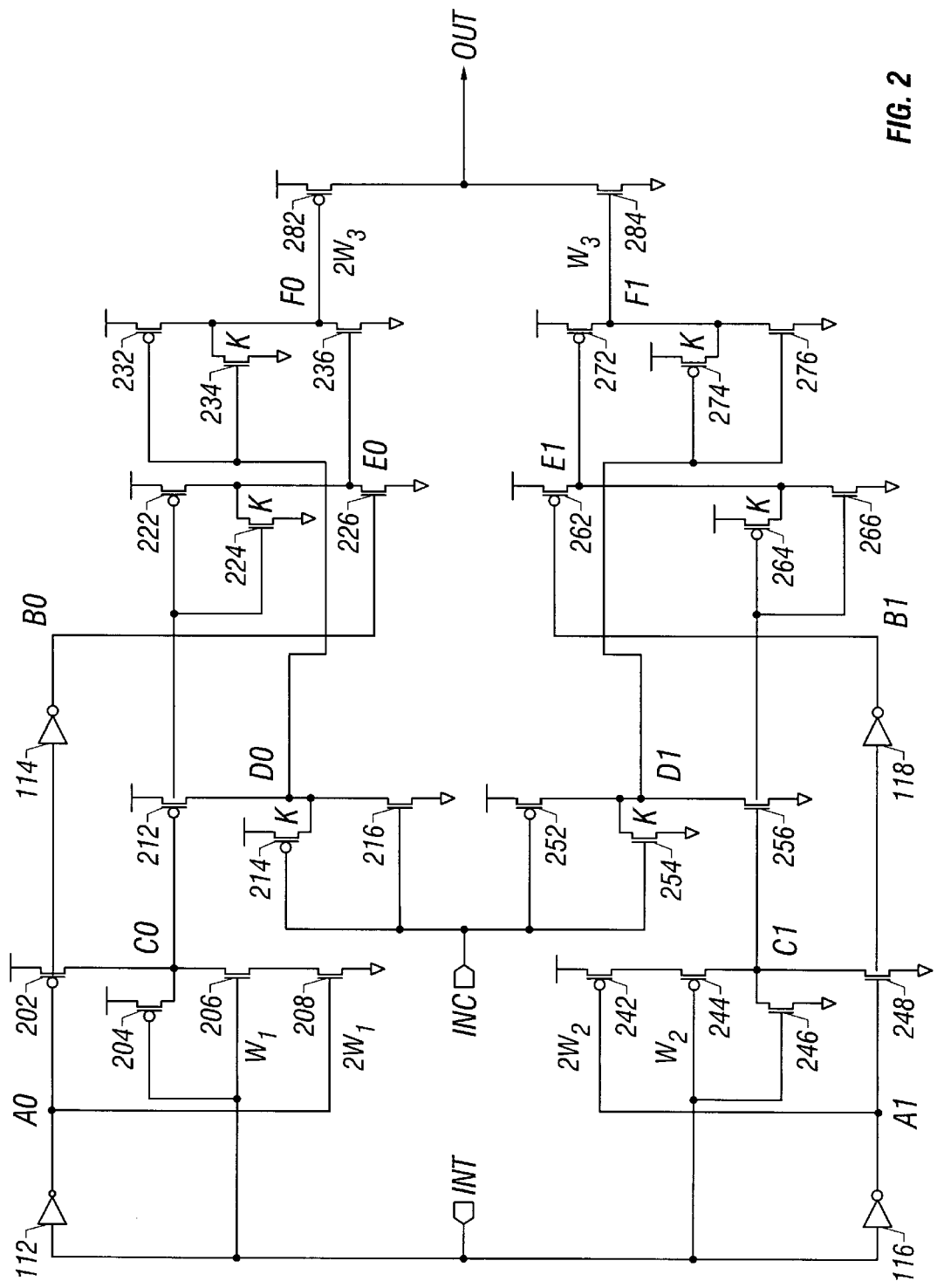
FIG. 2 is a circuit diagram of an output buffer according to an embodiment of the invention.

Referring to the embodiment of FIG. 2, the static state of buffer 100 will first be described when INT is low (and, therefore, INC is high). In the static state, transistors 202, 204, 206 and 208 are effectively a NAND gate having nodes INT and A0 as inputs and node C0 as an output. Thus, with INT low and A0 resultingly high, node C0 is high. When node C0 is high, transistor 212 is off. When transistor 212 is off, transistors 214 and 216 are effectively an inverter with INC as an input and node D0 as an output. Therefore, when INC is high, D0 is low. When D0 is low, transistor 232 is on, thereby driving node F0 to high. When F0 is high, transistor 282 is off. Furthermore, when INT is low, node A0 is high and node B0 is low. When node B0 is low, transistor 226 is off. When 226 is off, transistors 222 and 224 function effectively as an inverter. Therefore, because C0 is high, E0 is held low by the low impedance connection to ground through transistor 224. When E0 is low, transistor 236 is off, allowing transistors 232 and 234 to invert D0 to drive node F0 high. As noted, when F0 is high, transistor 282 is off, thereby isolating OUT from $V_{DD}$.

Also, in the static state, transistors 242, 244, 246 and 248 are effectively a NOR gate having INT and A1 as inputs and C1 as an output. Therefore, with INT low and A1 high, node C1 is low. When C1 is low, transistor 256 is off. When transistor 256 is off, transistors 252 and 254 are effectively an inverter with INC as an input and D1 as an output. Therefore, because INC is high in the presently described static state, node D1 is held low. When D1 is low, transistor 274 is on and transistor 276 is off, thereby charging node F1 to high. When node F1 is high, transistor 284 is on, thereby discharging OUT to low. Furthermore, when INT is low, node A1 is high and node B1 is low. When node B1 is low, transistor 262 is on, thereby driving node E1 high. Also, because C1 is low, node E1 is driven high by transistor 264. When E1 is high, transistor 272 is off, allowing transistors 274 and 276 to invert D1 to drive node F1 high. When F1 is high, transistor 284 is on forming a low impedance path from OUT to ground. Because pull-up transistor 282 is off and pull-down transistor 284 is on, OUT is held low in the static state with INT low.

The effect of a low-to-high transition of INT on buffer 100 will now be described. In the above described static state, INT is low, A0 is high, and C0 is high. When INT transitions from low to high, transistor 204 turns off and transistor 206 turns on, thereby causing node C0 to be pulled low through conducting transistors 206 and 208. Inverter 112 is a timing inverter and generates a high-to-low ramp transition on node A0 after INT transitions from low to high. (See FIGS. 3 and 4.) Node A0 ramps low such that A0 transitions from a logical high to a logical low after the propagation delay of inverter 112. C0 is pulled high again after inverter 112 ramps A0 low to shut off transistor 208 and turn on transistor 202. In this manner, signal C0 is a low pulse having a falling edge determined by the rising edge of INT and a rising edge determined by the falling edge of A0. C0 effectively provides an low pulse to the gate of transistor 212 in dynamic stage 148 and to the gates of transistors 222 and 224 in dynamic stage 144. The pulse has a width determined by the time that INT and A0 are both high (e.g., the propagation delay of inverter 112). The high-to-low transition of inverter 112 is slower than the low-to-high transition of inverter 112, and transistor 208 has twice the width of transistor 206, thus appearing as a dynamic inverter.

Node D0 is low when INT is low and INC is high. When INC transitions from high to low, transistor 216 is turned off and keeper transistor 214 is turned on, thereby pulling node D0 high. Substantial additional pull-up of D0 is provided on the falling edge of C0 whereupon D0 is pulled high as transistor 212 is turned on. When D0 is pulled high, transistor 232 is turned off and keeper transistor 234 is turned on so that node F0 is weakly pulled-down. E0 is pulled high on the falling edge of C0 as transistor 222 is turned on and keeper transistor 224 is turned off. Substantial additional pull-down of node F0 is provided when transistor 236 is turned on by node E1 transitioning to high. After transistor 234 starts the pull-down of node F0, transistor 236 discharges node F0 at approximately ten times the current than transistor 234. As F0 discharges, transistor 282 is turned on to drive OUT high.

Node E0 is reset from high to low when node B0 transitions high after the propagation delay of inverters 112 and 114. Consequently, E0 effectively provides a high pulse to dynamic stage 146 to provide additional pull-down to node F0 for a time period consisting of the propagation delay of inverter 114. The E0 pulse has a rising edge determined by the falling edge of C0 and a falling edge determined by the rising edge of B0. Keeper transistor 234 keeps node F0 staticly low, and transistor 236 is the main driver to the low state.

In the above described static state, INT is low, A1 is high, and C1 is held low by transistor 248. When INT transitions from low to high, transistor 246 turns on and transistor 244 turns off, thereby causing node C1 to continue to be held low through conducting transistor 248 and conducting keeper transistor 246. Inverter 116 is a timing inverter and generates a high-to-low ramp transition on node A1 after INT transitions from low to high. A1 transitions from a logical high to a logical low after the propagation delay of inverter 112, thereby turning off transistor 248 and turning on transistor 242. C1 is held low after inverter 112 ramps A0 low by keeper transistor 246. Because C1 remains low during the low-to-high transition of INT, transistors 256 and 266 remain off and transistor 264 remains on, as in the static state described above. Therefore, C1 has no time-dependent effect upon node E1 and subsequent nodes during a transition of INT from low to high. E1 remains high when INT transitions from low to high, and any change in the value of node F1 is determined by the value of node D1.

When transistor 256 is off because C1 is low, transistors 252 and 254 form a dynamic stage with a weak keeper 254 holding node D1 low when INC is high. When INC transitions low, transistor 252 pulls node D1 high. Thus, the stage shows dynamic speed due to the beta ratio of transistors 252 and 254, but has static features due to keeper transistor 254. When D1 transitions high, transistor 276 turns on to discharge node F1. When node F1 is discharged, transistor 284 turns off.

The static state of buffer 100 will now be described when INT is high (and, therefore, INC is low). In the static state, transistors 242, 244, 246 and 248 are effectively a NOR gate having INT and A1 as inputs and C1 as an output. Therefore, with INT high and A1 low, node C1 is low. When C1 is low, transistor 256 is off. When transistor 256 is off, transistors 252 and 254 are effectively an inverter with INC as an input and D1 as an output. Therefore, because INC is low in the presently described static state, node D1 is held high. When D1 is high, transistor 274 is off and transistor 276 is on, thereby discharging node F1 to low. When node F1 is low, transistor 284 is off, thereby isolating OUT from ground. Furthermore, when INT is high, node A1 is low and node B1 is high. When node B1 is high, transistor 262 is off, thereby isolating node E1 from $V_{DD}$ so that the value of node E1 is determined by the value of C1. Because C1 is low, node E1 is held high by transistor 264. When E1 is high, transistor 272 is off, allowing transistors 274 and 276 to invert D1 to drive node F1 low. When F1 is low, transistor 284 is off, thereby isolating OUT from ground.

Also, in the static state, transistors 202, 204, 206 and 208 are effectively a NAND gate having nodes INT and A0 as inputs and node C0 as an output. Thus, with INT high and A0 resultingly low, node C0 is high. When node C0 is high, transistor 212 is off. When transistor 212 is off, transistors 214 and 216 are effectively an inverter with INC as an input and node D0 as an output. Therefore, when INC is low, D0 is high. When D0 is high, transistor 232 is off and transistor 234 is on, thereby holding node F0 low. When F0 is low, transistor 282 is on. Furthermore, when INT is high, node A0 is low and node B0 is high. When node B0 is high, transistor 226 is on. When 226 is on, node E0 is pulled to ground. Also, further pull-down of node E0 is provided when C0 is high and transistor 234 is on. When E0 is low, transistor 236 is off, allowing transistors 232 and 234 to invert D0 to drive node F0 low. As noted, when F0 is low, transistor 282 is on. Because pull-down transistor 284 is off and pull-up transistor 282 is on, OUT is held high in the static state with INT high.

The effect of a high-to-low transition of INT on buffer 100 will now be described. In the immediately above described static state, INT is high, A0 is low, and C0 is held high by transistor 202. When INT transitions from high to low, transistor 204 turns on and transistor 206 turns off, thereby causing node C0 to continue to be held high through conducting transistor 202 and conducting keeper transistor 204. Inverter 112 is a timing inverter and generates a low-to-high transition on node A0 after INT transitions from high to low. A0 transitions from a logical low to a logical high after the propagation delay of inverter 112, thereby turning off transistor 202 and turning on transistor 208. Thus, C0 is held high by keeper transistor 204 after inverter 112 ramps A0 high. Because C0 remains high during the high-to-low transition of INT, transistors 212 and 222 remain off and transistor 224 remains on, as in the static state described above. Therefore, C0 has no time changing affect upon node E0 and subsequent nodes during a high-to-low transition of INT. E0 remains low when INT transitions from high to low, and any change in the value of node F0 is determined by the value of node D0.

When transistor 212 is off (C0 is high), transistors 214 and 216 form a dynamic stage with a weak keeper 214 holding node D0 high when INC is low. When INC transitions high, transistor 216 pulls node D0 low. Thus, the stage shows dynamic speed due to the beta ratio of transistors 214 and 216, but has static features due to keeper transistor 214. When D0 transitions low, transistor 232 turns on to charge node F0. When node F0 is charged, transistor 282 turns off.

In the static state in which INT is high, A1 is low, and C1 is low. When INT transitions from high to low, transistor 246 turns off and transistor 244 turns on, thereby causing node C0 to be weakly pulled high through already conducting transistor 242. Inverter 116 is a timing inverter and generates a low-to-high ramp transition on node A1 after INT transitions from high to low. (See FIGS. 3 and 4.) Node A1 ramps high such that A1 transitions from a logical low to a logical high after the rising edge propagation delay of inverter 116. C1 is pulled low after inverter 116 ramps A1 high to shut off transistor 242 and turn on transistor 248. In this manner, signal C1 is a high pulse having a rising edge determined by the falling edge of INT and a falling edge determined by the rising edge of A1. C1 effectively provides an high pulse to the gate of transistor 256 in dynamic stage 158 and to the gates of transistors 264 and 266 in dynamic stage 154. The pulse has a width determined by the time that INT and A1 are both low (e.g., the propagation delay of inverter 116). The low-to-high transition of inverter 116 is slower than the high-to-low transition of inverter 116, and transistor 242 has twice the width of transistor 244; thus, dynamic stage 152 appears as a dynamic inverter.

Node D1 is high when INT is high and INC is low. When INC transitions from low to high, transistor 252 is turned off and keeper transistor 254 is turned on, thereby pulling node D1 low. Substantial additional pull-down of D1 is provided on the rising edge of C1 whereupon D1 is pulled low as transistor 256 is turned on. When D1 is pulled low, transistor 276 is turned off and keeper transistor 274 is turned on so that node F1 is weakly pulled-up. E1 is pulled low on the rising edge of C1 as transistor 266 is turned on and keeper transistor 264 is turned off. Substantial additional pull-up of node F1 is provided when transistor 272 is turned on by node E1 transitioning to low. Transistor 274 starts the pull-up of node F1, and transistor 272 charges node F1 at approximately ten times the current than transistor 274. As F1 charges, transistor 284 is turned on to drive OUT low.

Node E1 is reset from low to high when node B1 transitions low after the propagation delay of inverters 116 and 118. Consequently, E1 effectively provides a low pulse to dynamic stage 156 to provide additional pull-up to node F1 for a time period consisting of the propagation delay of inverter 118. The E1 pulse has a falling edge determined by the rising edge of C1 and a rising edge determined by the falling edge of B1. Keeper transistor 274 keeps node F1 staticly high, and transistor 272 is the main driver to the high state.

Figure 5:
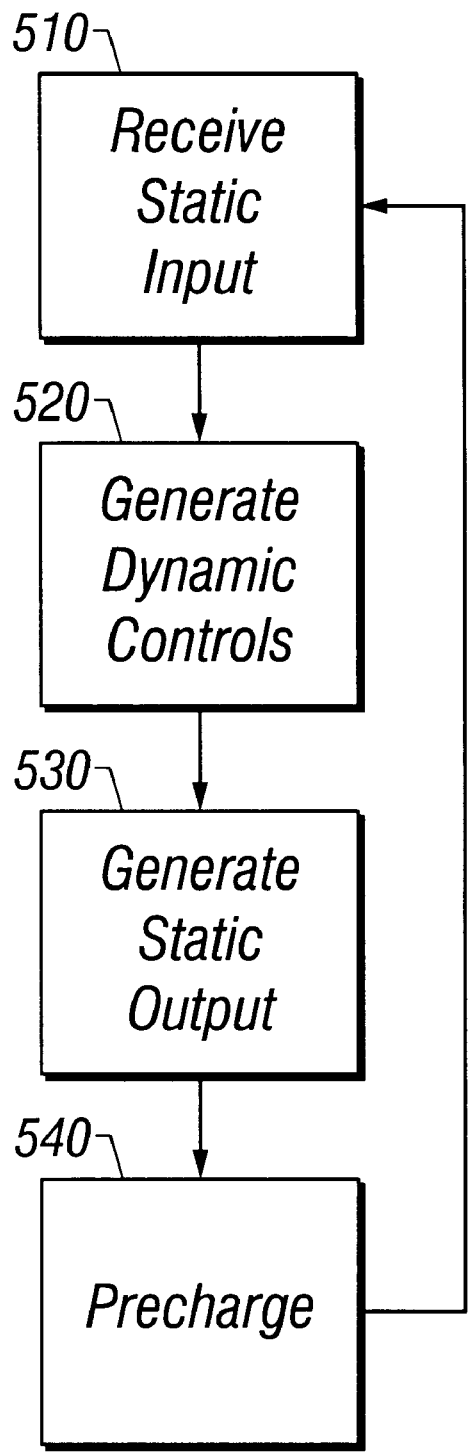
FIG. 5 is a flow chart showing the operation of an embodiment of a buffer in accordance with an embodiment of the present invention.

FIG. 5 shows the process by which a static signal is buffered in a mixed static/dynamic buffer 100. At step 510, a static input signal is received at an input of buffer 100. For example, static input stage 110 and dynamic stage 120 each receive true input signal INT. Control then transitions to step 520. During step 520, dynamic circuit block 120 generates dynamic control signals A0–F0 and A1–F1. Control then transitions to step 530. During step 530, static output stage 130 generates static output signal OUT responsive to a first edge of a dynamic control signal. Control then transitions to step 540. During step 540, static input stage 110 generates precharge signals to place buffer 100 into a state of precharge after the signals representative of the static input signal INT propagate through buffer 100 to static output stage 130. In the present embodiment, precharge signals A0, A1, B0 and B1 are generated to precharge dynamic stages 142, 144, 152 and 154. Thus, the first edges of control signals dynamically propagate information representative of input signal INT through buffer 100, and precharge signals reset buffer 100 into a precharged state so that buffer 100 is ready for further transitions of input signal INT.

As noted, static output stage 130 includes a CMOS circuit to drive static signal OUT. As in a typical static CMOS circuit, OUT is driven between first and second values by being coupled to first and second power rails respectively and alternatively. Dynamic block 120 controls the CMOS circuit so as to disconnect the first power rail before connecting the second power rail to node OUT to drive OUT to the second value, and to disconnect the second power rail before connecting the first power rail to node OUT to drive OUT to the first value. That is, each off path of dynamic block 120 is faster than the complementary on path of dynamic block 120.

Figure 4A:
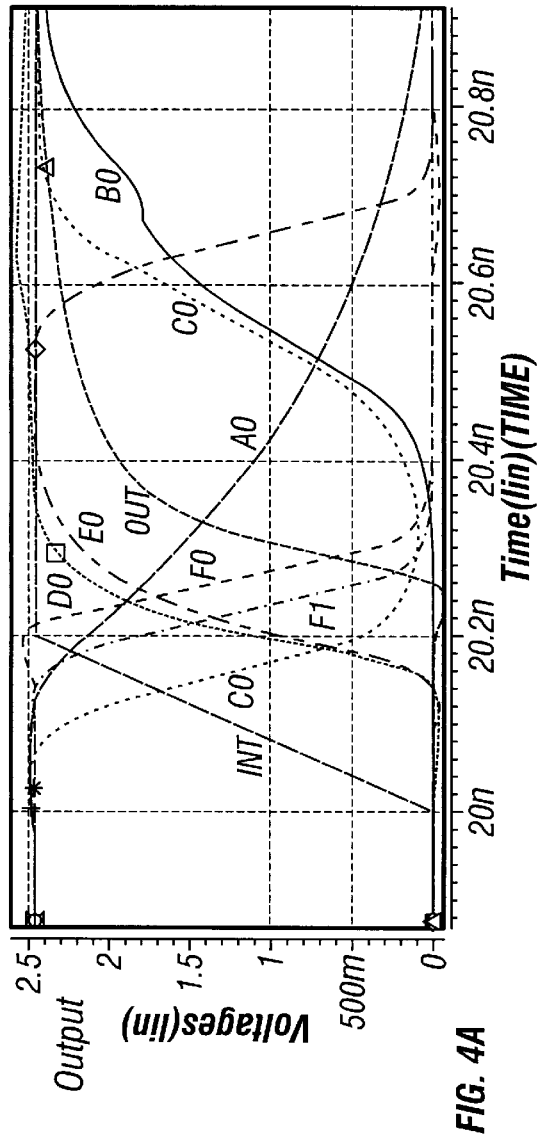
FIG. 4A is a timing diagram showing the operation of an output buffer during a low-to-high data input transition according to an embodiment of the invention.

For example, when INT transitions from low to high, transistor 284 is turned off before transistor 282 is turned on. In this way, crowbar or short circuit current $V_{DD}$ to ground is minimized or prevented. In the present example, the off path consists of input INC, nodes D1 & F1 and transistor 284. When INC transitions from high to low, node D1 is pulled high and node F1 is pulled low, thereby turning off transistor 284. The on path consists of input INT, nodes C0, E0 and F0, and transistor 282. When INT transitions from low to high, node C0 is initially pulled low, node E0 is initially pulled high, and node F0 is pulled low, thereby turning on transistor 282. Because the off path includes fewer gates than the on path and because the on path includes more delay than the off path, any potential crowbar current from $V_{DD}$ to ground is minimized or prevented. FIG. 4A shows F1 being pulled low before F0. Thus, the time period from a first time when INC transitions low to a second time when transistor 284 turns off is shorter than the time period from a fourth time when INT transitions high to a fifth time when transistor 282 turns on to charge node OUT.

Figure 4B:
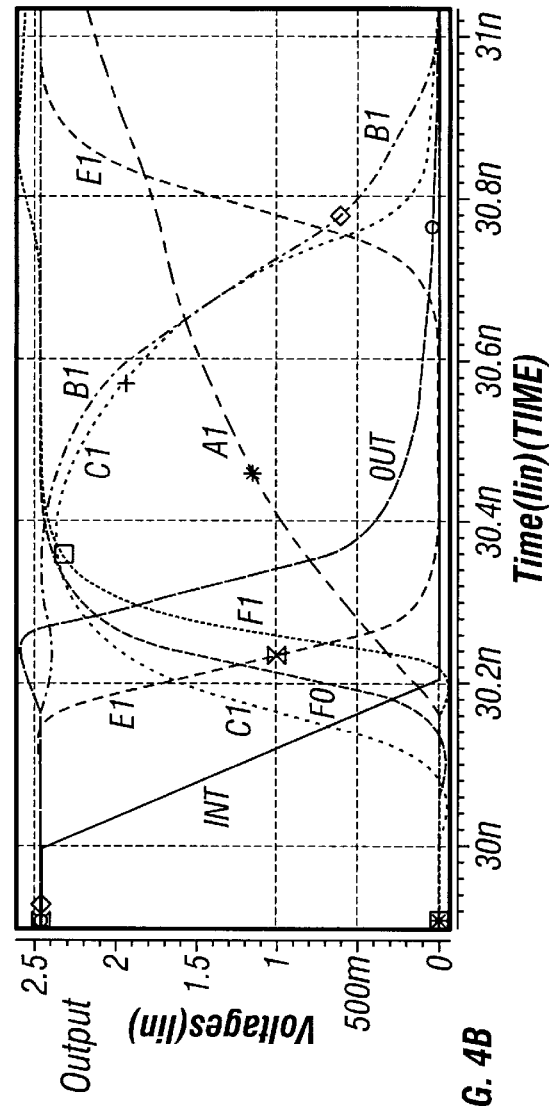
FIG. 4B is a timing diagram showing the operation of an output buffer during a high-to-low data input transition according to an embodiment of the invention.

For further example, when INT transitions from high to low, transistor 282 is turned off before transistor 284 is turned on. The off path consists of input INC, nodes D0 & F0 and transistor 282. When INC transitions from low to high, node D0 is pulled low and node F0 is pulled high, thereby turning off transistor 282. The on path consists of input INT, nodes C1, E1 and F1, and transistor 284. When INT transitions from high to low, node C1 is initially pulled high, node E1 is initially pulled low, and node F1 is pulled high, thereby turning on transistor 284. Because the off path includes fewer gates and because the on path includes more delay than the off path, any potential crowbar current is minimized or prevented. Specifically, FIG. 4B shows F0 being pulled high before F1. Thus, the time period from a first time when INC transitions high to a second time when transistor 282 turns off is shorter than the time period from a third time when INT transitions high to a fourth time when transistor 284 turns on to discharge node OUT.

In the above described embodiment, the operation of dynamic stages 142, 148, 144, 146, 152, 158, 154 and 156 has been described with reference to an active high signal convention. Such a convention is exemplary and other embodiments of the invention may use other signal conventions. Furthermore, in many cases, the change in state or the edge of the signal is the relevant factor, and different embodiments may use different circuitry to generate and sense different types of signal transitions.

Each of the transistors used in the above described embodiment may be conceptualized as having a control terminal which controls the flow of current between a first current handling terminal and a second current handling terminal. An appropriate condition on the control terminal causes a current to flow from/to the first current handling terminal and to/from the second current handling terminal.

Although MOS transistors are frequently discussed as having a drain, a gate, and a source, in most such devices the drain is interchangeable with the source. This is because the layout and semiconductor processing of the transistor is symmetrical (which is typically not the case for bipolar transistors). For an N-channel MOS transistor, the current handling terminal normally residing at the higher voltage is customarily called the drain. The current handling terminal normally residing at the lower voltage is customarily called the source. A sufficient voltage on the gate causes a current to therefore flow from the drain to the source. The gate to source voltage referred to in an N channel MOS device equation merely refers to whichever diffusion (drain or source) has the lower voltage at any given time. For example, the "source" of an N channel device of a bidirectional CMOS transfer gate depends on which side of the transfer gate is at a lower voltage. To reflect the symmetry of most N channel MOS transistors, the control terminal is the gate, the first current handling terminal may be termed the "drain/source", and the second current handling terminal may be termed the "source/drain". Such a description is equally valid for a P channel MOS transistor, since the polarity between drain and source voltages, and the direction of current flow between drain and source, is not implied by such terminology. Alternatively, one current handling terminal may be arbitrarily deemed the "drain" and the other deemed the "source", with an implicit understanding that the two are not distinct, but interchangeable.

Buffer 100 may be used in any of various circuit macros to buffer data. In one embodiment of the invention, an integrated circuit includes buffer 100. Such an exemplary integrated circuit may include a microprocessor. As noted, buffer 100 is useful as an output register in a cache memory system of a microprocessor. An exemplary microprocessor which may include an embodiment of the invention is disclosed in U.S. provisional application Ser. No. 60/027, 329, filed Sep. 30, 1996, entitled "An X86 Microprocessor with Multi-Media Extensions" and naming Donald A. Draper, Matthew P. Crowley, John Holst, John G. Favor, Amos Ben-Meir, Jeffery E. Trull, Raj Khanna, Dennis Wendell, Ravikrishna Cherukuri, Joe Nolan, Hamid Partovi, Mark Johnson, and Tom Lee as inventors, which is incorporated herein by reference in its entirety.

Figure 6:
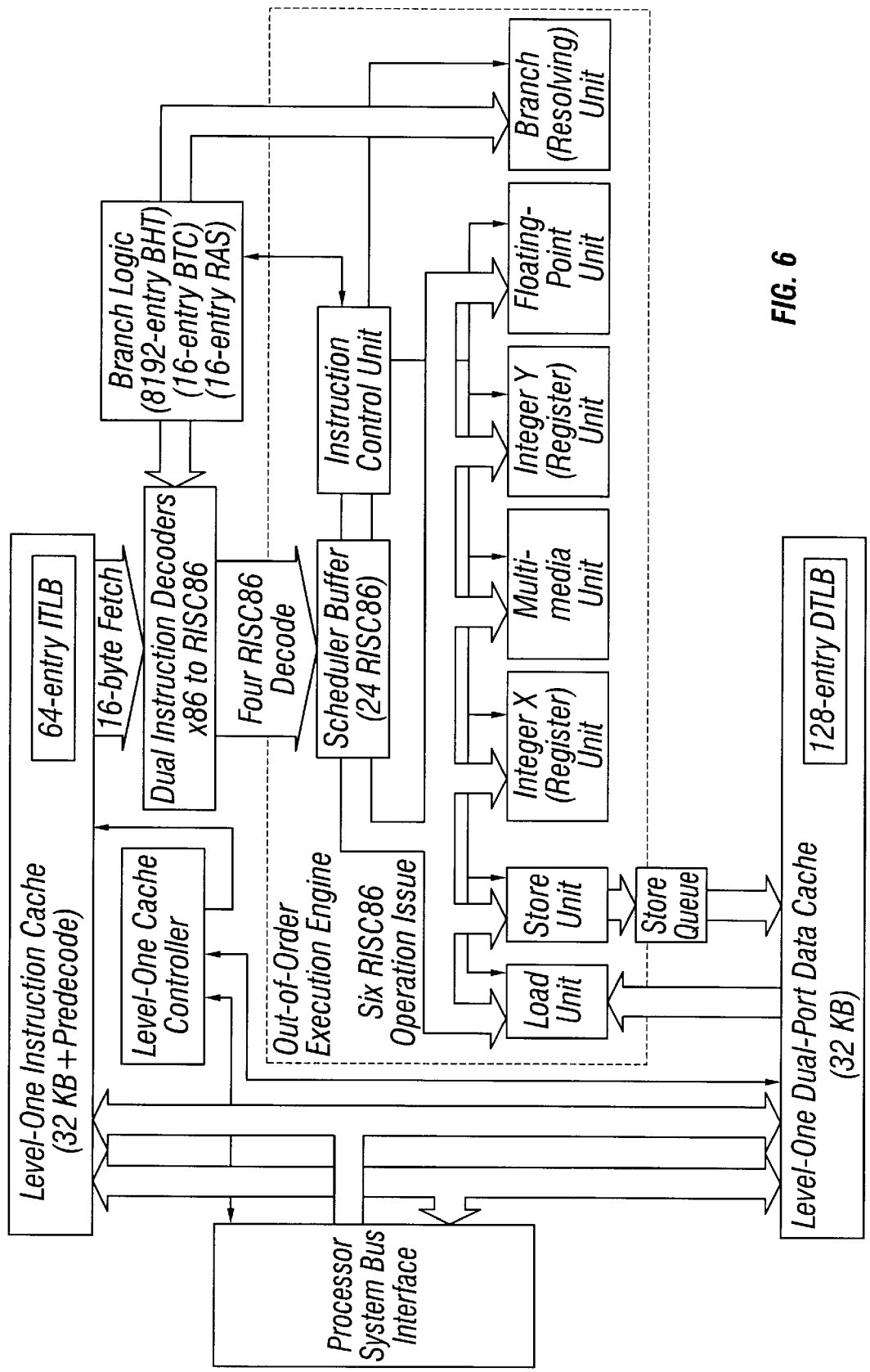
FIG. 6 is an architectural block diagram showing a microprocessor in accordance with an embodiment of the present invention.

FIG. 6 is an architectural block diagram which illustrates an embodiment of a microprocessor in accordance with an embodiment of the present invention. The microprocessor 600 is an X86 instruction set-compatible microprocessor implementing a set of Multi-Media eXtenstions (MMX). A level-one (L1) instruction cache 602 begins predecoding instructions obtained from a processor system bus interface 604 during filling of the 32KB two-way associative L1 instruction cache 602. The L1 instruction cache 602 includes a 64-entry instruction translational lookaside buffer (ITLB) 646. Bypass (not shown) and storage buffers (not shown) for instructions (4×16) and predecode (4×20) to the L1 instruction cache 602 are supplied to allow data-in and data flow-back to cache output terminals.

The L1 instruction cache 602 uses a Most Recently Used (MRU) prediction technique to predict the way selection on cache accesses. A misprediction in the way selection results in a penalty of one cycle. The L1 instruction cache 602 line replacement algorithm is Least Recently Used (LRU) although an alternative random replacement algorithm is supported using an SR5.ICERLR configuration bit. The L1 instruction cache 602 also supports a direct-mapped replacement algorithm, reducing the cache size from 32KB to 16KB, using an SR5.ICDM configuration bit.

The L1 instruction cache 602 performs a simple prefetching algorithm. When a line miss occurs, as distinguished from a sub-block miss, and the miss occurs on sub-block 0 of the line (bit[5] of the address is 0), then both sub-blocks are fetched and pipelined on the bus.

Predecode bits resolved during the predecoding operation are stored in a 20KB predecode cache (not shown). Predecode logic 606 includes a first stage of instruction decode logic. Data from the L1 instruction cache 602 are fetched by fetch logic 608 and transferred to dual instruction decoders 610. The dual instruction decoders 610 decodes up to two X86 instructions per clock and translates most instructions through a direct hardware decode operation into from one to four RISC-like operations, called RISC86 Ops. The hardware-decoded instructions are generally simple and common-type instructions. Other complex or uncommon instructions are mapped into ROM-resident sequences of RISC Ops using emulation code ROM translation.

Decoded instructions from the dual instruction decoders 610 are transferred to a RISC86 Op Scheduler and buffer 612. The RISC86 Op Scheduler 612 holds up to 24 RISC Ops and stores a total of 48 registers using register renaming. The RISC86 Op Scheduler 612, under control of an instruction control unit 614, issues up to six RISC86 Operations using out-of-order issuing to seven parallel execution units. The execution units speculatively execute the RISC86 Ops to generate results. The RISC86 Op Scheduler 612 retires the results in-order. The execution units include a load unit 616, a store unit 618, an integer X register unit 620, a Multi-Media extension (MMX) unit 622, an integer Y register unit 624, a floating-point unit (FPU) 626, and a branch resolving unit 628. A branch logic unit 630 implements a branch prediction operation that uses two-level branch prediction based on an 8192-entry Branch History Table (BHT) 632, a 16-entry Branch Target Cache (BTC) 634, and a 16-entry Return Address Stack (RAS) 636.

The dual instruction decoders 610 translate X86 instructions on-the-fly into corresponding RISC86 Ops. The RISC86 Ops are executed by an instruction core 638 that is essentially a RISC superscalar processing engine. The fetch logic 608 fetches up to sixteen instruction bytes each cycle from the L1 instruction cache 602 and transfers the instruction bytes into an instruction buffer (not shown) preceding the dual instruction decoders 610 so that the instruction buffer is maintained at capacity. The dual instruction decoders 610 accesses the instruction bytes from the instruction buffer, decodes up to two X86 instructions, immediately recognizes and predicts branches, and generates up to four RISC86 Ops. The RISC86 Ops are loaded into the unified RISC86 Op Scheduler 612. The RISC86 Op Scheduler 612 controls and tracks multiple aspects of RISC86 Op issue and execution.

Each cycle up to six RISC86 Ops are issued and executed in a pipelined manner. The six RISC86 Ops may include one memory read operation, one memory write operation, two integer and/or one multi-media register operation, one floating point operation, and one evaluation of a branch condition. The RISC86 Ops are executed out-of-order and are executed subject principally to actual dependencies and resource constraints. One example of a resource constraint is that a maximum of two integer register operations (RegOps) is executed per cycle. Once execution of the RISC86 Ops is complete, the RISC86 Op Scheduler 612, functioning as a reorder buffer, commits the RISC86 Ops in-order to ensure precise exception handling and full operational compatibility with X86 architecture standards. The RISC86 Op Scheduler 612 performs implicit register renaming based upon position within the scheduler buffer (queue) rather than explicit tag assignments that are conventionally employed in systems that use a reorder buffer. The position-based register renaming reduces the size of renaming hardware. The RISC86 Op Scheduler 612 has a first-in-first-out (FIFO) buffer physical structure and performs implicit register renaming, characteristics which, in combination, advantageously permit the use of fast position-based instruction issue and dependency-tracking logic. The dependency-tracking logic has characteristics of many fast adder circuits in which the process of searching for a particular operand is similar to the arithmetic operation of propagating a carry through an adder.

The load unit 616 loads data via a level-one (L1) dual-port data cache 640 which receives data from an external memory (not shown) via the processor system bus interface 604. Bypass (not shown) and storage buffers (not shown) for data (4×16) to the data cache 640 are supplied to allow data-in and data flow-back to cache output terminals.

The data cache 640 includes a 128-entry data translational lookahead buffer (DTLB) 644. The data cache 640 is a 2-way set-associative, 32KB size cache with a 64 byte line-size and 32-byte sub-blocking. The data cache 640 fills on the basis of the 32-byte sub-block units. In contrast to the L1 instruction cache 602, the data cache 640 uses a Least Recently Missed (LRM) selection technique which is generally a more accurate way selection scheme than the LRU technique of the L1 instruction cache 602. In the LRM scheme, the line that first enters the cache is replaced. An alternative random replacement algorithm is supported and activated through usage of a SR5.DCERLR configuration bit. The data cache 640 also supports a direct-mapped replacement algorithm, reducing the cache size from 32KB to 16KB, using an SR5.DCDM configuration bit.

The data cache 640 supports write allocation, which is disabled by setting an SR5.WAD configuration bit. Write allocation is allowed when caching is enabled through miscellaneous cache enable/disable bits and either of two conditions is true. A first condition is that a write operation hits on a line but misses on the requested sub-block. The second condition is that a write operation missed on a line but hit on a one-page cacheability control register used specifically on write-allocate operations. The cacheability control register is invalidated during RESET, translation lookaside buffer invalidations, or cache invalidations initiated by an INVD/WBINVD instruction. Snoop invalidations do not affect the cacheability control register. The cacheability control register is updated/validated on every fill with the page address of the line that was filled into the cache upon initiation by a load operation. Another cacheability control register is validated on write operations to the bus when the writes are determined to be cacheable.

The data cache 640 supports one read operation and one write operation on each cycle to either independent or dependent addresses. Stalls occur on cache misses or when a data dependency occurs that is not handled by hardware. For example, a stall takes place upon the occurrence of a read operation with a superset dependency on an older write operation that has not yet been cached. A superset dependency is defined as a read operation that requests more bytes than a write operation can supply. Address dependencies are detected by monitoring the number of requested bytes and a limited number of address bits (address bits [9:0]) due to timing constraints so that false dependencies may be detected, resulting in unnecessary stalls. The store unit 618 transfers data to the data cache 640 through a store queue 642.

The MMX unit 622 is implemented to incorporate an X86 instruction subset called the Multi-Media extensions (MMX) thereby supporting a growing number of applications in the areas of communications and multimedia. The MMX unit 622 supports the new instructions and the new data types that are defined by the MMX standard to increase processor performance in the targeted applications. The MMX unit 622 executes a Single Instruction, Multiple Data (SIMD) technique to process multiple operands of 8, 16, or 32 bits in a 64-bit data path to perform highly parallel and computationally intensive algorithms that are typical for multimedia applications. The MMX unit 622 supports 57 new instructions that execute additions, subtractions, multiplies, multiply-accumulates, logical shifts, arithmetic shifts, and several other operations. Most operations are executed on operands of any data type.

In one embodiment, each of the data, instruction, and predecode caches of microprocessor 600 include a plurality of multiplexed-input registers 100. For example, the outputs of registers 100 are passed through NOR gates for generation of write and read addresses into the row predecode which is used for both half clock periods. Other embodiments may include multiplexed-input registers 100 in various other blocks or macros within a microprocessor such as the AMD-K6 microprocessor 600.

In another embodiment, a computer system includes integrated circuits which use buffer 100. Computer systems are information handling systems which can be designed to give independent computing power to one user or a plurality of users. Computer systems may be found in many forms including, for example, mainframes, minicomputers, workstations, servers, personal computers, internet terminals, notebooks and embedded systems. Personal computer (PC) systems, such as the International Business Machines (IBM) compatible PC systems, include desk top, floor standing, or portable versions. A typical PC system is a microcomputer that includes a system board, microprocessor, associated memory and control logic and any number of peripheral devices that provide input and output (I/O) for the system. Such PC systems typically use a system board to electrically connect these components together. Buffer 100 may be included in a computer system processor, or more generally, in various chip sets which may be coupled to a PC system board.

Buffer 100 may be used in any of various circuit macros to drive data from one block to the next to increase fan-out, isolate the driving circuit from the driven circuit, to increase buffer speed, and/or to reduce circuit noise, etc. In other embodiments of the invention, information processing systems couple dynamic logic within CMOS logic such that a clock is not required for the dynamic logic.

While the invention has been described with reference to various embodiments, it will be understood that these embodiments are illustrative and that the scope of the invention is not limited to them. Many variations, modifications, additions, and improvements of the embodiments described are possible. For example, regarding the signals described herein, those skilled in the art will recognize that a signal may be directly transmitted from a first logic block to a second logic block, or a signal may be modified (e.g., amplified, attenuated, delayed, latched, encoded, decoded, inverted, filtered, divided, digitized or otherwise converted, etc.) between the logic blocks. Although the signals of the above described embodiment are characterized as transmitted from one block to the next, other embodiments of the invention include modified signals in place of such directly transmitted signals. To some extent, a second signal input at a second logic block is always a signal derived from a first signal output from a first logic block due to physical limitations of the circuitry involved (e.g., there will always be some attenuation and delay). Therefore, as used herein, a second signal derived from a first signal includes the first signal or any modifications to the first signal, whether due to circuit limitations or due to passage through other circuit elements.

Furthermore, those skilled in the art will recognize that circuit elements in circuit diagrams and boundaries between logic blocks are merely illustrative and that alternative embodiments may merge logic blocks or circuit elements or impose an alternate decomposition of functionality upon various logic blocks or circuit elements. For example, although input circuit 111 is shown as being included within static input stage 110, input circuit 111 may be a separate logic block from that of static input stage 110. Moreover, alternative embodiments may combine multiple instances of a particular component. These and other variations, modifications, additions, and improvements may fall within the scope of the invention as defined in the claims which follow.

What is claimed is:

1. A buffer comprising:
   a dynamic circuit block receiving static true and complement input signals, the dynamic circuit block providing dynamic output control signals responsive to receiving the true and complement input signals, the dynamic circuit block dynamically changing the dynamic output control signals responsive to detecting a transition of the true input signal, the dynamic circuit block not receiving a clock signal;
   a static output block coupled to receive the dynamic output control signals from the dynamic circuit block, the static output block providing a static output signal responsive to receiving the dynamic output control signals such that the static output signal has a logical value the same as a logical value of the true input signal after the dynamic circuit block dynamically changes the dynamic output control signals; and
   a static input block coupled to receive the true input signal, the static input block precharging the dynamic circuit block after the dynamic circuit block dynamically changes the dynamic output control signals.

2. A buffer, as recited in claim 1, further comprising:
   an input circuit coupled to receive the true input signal, the input circuit inverting the true input signal to generate the complement input signal, the input circuit outputting the true and complement input signals to the dynamic block.

3. A buffer, as recited in claim 1, wherein
   the static input block includes delay circuitry for generating recover signals for restoring the dynamic circuit block to a precharged state after a delay from a transition of the true input signal, the delay being longer than a time between a transition of the true input signal and a change of the static output signal corresponding to the transition of the true input signal.

4. A buffer, as recited in claim 1, wherein the dynamic output control signals include up and down control signals; and the static output block includes a pull-up circuit coupled to receive the up control signal, the pull-up circuit activating responsive to the up control signal having a first logical value and deactivating responsive to the up control signal having a second logical value, the pull-up circuit driving an output signal to a high logical value responsive to being activated; and a pull-down circuit coupled to receive the down control signal, the pull-down circuit activating responsive to the down control signal having a first logical value and deactivating responsive to the down control signal having a second logical value, the pull-up circuit driving the output signal to a low logical value responsive to being activated.

5. A buffer, as recited in claim 4, wherein the dynamic circuit block comprises:

a pull-up control circuit for dynamically providing the up control signal responsive to receiving the true and complement input signals; and a pull-down control circuit for dynamically providing the down control signals responsive to receiving the true and complement input signals.

6. A buffer, as recited in claim 5, wherein the pull-up control circuit includes a number of pull-up dynamic stages coupled in series for generating the up control signal; and the pull-down control circuit includes the number of dynamic pull-down stages coupled in series for generating the down control signal, the number of dynamic stages coupled in series determining fan-out of the buffer.

7. A buffer, as recited in claim 5, wherein the pull-up control circuit includes
    an on path for activating the pull-up circuit of the static output block; and
    an off path for deactivating the pull-up circuit of the static output block; and the pull-down control circuit includes
    an on path for activating the pull-up circuit of the static output block; and
    an off path for deactivating the pull-up circuit of the static output block.

8. A buffer, as recited in claim 7, wherein the on path for activating the pull-up control circuit includes a plurality of up-on dynamic stages coupled in series, a first one of the up-on dynamic stages being coupled to receive the true input signal, the first one of the up-on dynamic stages providing an activation signal to a next one of the up-on dynamic stages, the activation signal provided by the first one of the up-on dynamic stages having a first edge responsive to receiving a low-to-high transition of the true input signal, a last one of the up-on dynamic stages being coupled to receive an activation signal from a previous one of the up-on dynamic stages, the last one of the up-on dynamic stages driving the up control signal to the first value for activating the pull-up circuit of the static output block responsive to receiving the first edge of the activation signal from the previous one of the up-on dynamic stages;

the off path for deactivating the pull-up control circuit includes a plurality of up-off dynamic stages, a first one of the up-off dynamic stages being coupled to receive the complement input signal, the first one of the up-off dynamic stages providing a deactivation signal to a next one of the up-off dynamic stages responsive to receiving a low-to-high transition of the complement input signal, a last one of the up-off dynamic stages being coupled to receive a deactivation signal from a previous one of the up-off dynamic stages, the last one of the up-off dynamic stages driving the up control signal to the second value for deactivating the pull-up circuit of the static output block responsive to receiving a deactivation signal from a previous one of the up-off dynamic stages;

the on path for activating the pull-down control circuit includes a plurality of down-on dynamic stages coupled in series, a first one of the down-on dynamic stages being coupled to receive the true input signal, the first one of the down-on dynamic stages providing an activation signal to a next one of the down-on dynamic stages, the activation signal provided by the first one of the down-on dynamic stages having a first edge responsive to receiving a high-to-low transition of the true input signal, a last one of the down-on dynamic stages being coupled to receive an activation signal from a previous one of the down-on dynamic stages, the last one of the down-on dynamic stages driving the down control signal to the first value for activating the pull-down circuit of the static output block responsive to receiving the first edge of the activation signal from the previous one of the down-on dynamic stages; and the off path for deactivating the pull-down control circuit includes a plurality of down-off dynamic stages, a first one of the down-off dynamic stages being coupled to receive the complement input signal, the first one of the down-off dynamic stages providing a deactivation signal to a next one of the down-off dynamic stages responsive to receiving a high-to-low transition of the complement input signal, a last one of the down-off dynamic stages being coupled to receive a deactivation signal from a previous one of the down-off dynamic stages, the last one of the down-off dynamic stages driving the down control signal to the second value for deactivating the pull-down circuit of the static output block responsive to receiving a deactivation signal from a previous one of the down-off dynamic stages.

9. A buffer, as recited in claim 8, wherein the last of the up-on dynamic stages is the same as the last of the up-off dynamic stages; and the last of the down-on dynamic stages is the same as the last of the down-off dynamic stages.

10. A buffer, as recited in claim 8, wherein the static input block includes delay circuitry for generating recover signals for restoring the dynamic circuit block to a precharged state after transition of the true and complement signals.

11. A buffer, as recited in claim 10, wherein the delay circuitry generates a plurality of recover signals having edges delayed from a transition of the true input signal, each dynamic stage that is not in one of the off paths being coupled to receive a respective one of the plurality of the recover signals, each dynamic stage receiving one of the recover signals entering a precharge state responsive to receiving the respective one of the recover signals.

12. A buffer, as recited in claim 7 wherein the on path for activating the pull-up control circuit includes
- a first dynamic stage coupled to receive the true input signal, the first dynamic stage providing a first pulse signal having a first edge responsive to receiving a low-to-high transition of the true input signal;
- a second dynamic stage coupled to receive the first pulse signal, the second dynamic stage providing a second pulse signal having a first edge responsive to receiving the first edge of the first pulse signal; and
- a third dynamic stage coupled to receive the second pulse signal, the third dynamic stage providing the up control signal having a first value for activating the pull-up circuit of the static output block responsive to receiving the first edge of the second pulse signal;

the off path for deactivating the pull-up control circuit includes
- a first dynamic stage coupled to receive the complement input signal, the first dynamic stage providing a deactivation signal responsive to receiving a low-to-high transition of the complement input signal, the third dynamic stage of the on path providing the up control signal having a second value for deactivating the pull-up circuit of the static output block responsive to receiving the deactivation signal;

the on path for activating the pull-down control circuit includes
- a first dynamic stage coupled to receive the true input signal, the first dynamic stage providing a first pulse signal having a first edge responsive to receiving a high-to-low transition of the true input signal;
- a second dynamic stage coupled to receive the first pulse signal, the second dynamic stage providing a second pulse signal having a first edge responsive to receiving the first edge of the first pulse signal; and
- a third dynamic stage coupled to receive the second pulse signal, the third dynamic stage providing the up control signal having a first value for activating the pull-down circuit of the static output block responsive to receiving the first edge of the second pulse signal;

the off path for deactivating the pull-down control circuit includes
- a first dynamic stage coupled to receive the complement input signal, the first dynamic stage providing a deactivation signal responsive to receiving a high-to-low transition of the complement input signal, the third dynamic stage of the on path providing the down control signal having a second value for deactivating the pull-down circuit of the static output block responsive to receiving the deactivation signal.

13. A buffer, as recited in claim 12, wherein the static input block includes delay circuitry for generating recover signals for restoring the dynamic circuit block to a precharged state after transition of the true and complement signals.

14. A buffer, as recited in claim 13, wherein the delay circuitry of the static input block comprises:

a first delay circuit generating a first recover signal having an edge delayed from a transition of the true input signal responsive to receiving the transition of the true input signal, the first recover signal being coupled to the first dynamic stage of the on path of the up control circuit, the first dynamic stage of the on path of the up control circuit providing the corresponding first pulse signal having a second edge responsive to receiving the first recover signal;

a second delay circuit generating a second recover signal having an edge delayed from a transition of the first recover signal responsive to receiving the transition of the first recover signal, the second recover signal being coupled to the second dynamic stage of the on path of the up control circuit, the second dynamic stage of the on path of the up control circuit providing the corresponding second pulse signal having a second edge responsive to receiving the second recover signal;

a third delay circuit generating a third recover signal having an edge delayed from a transition of the true input signal responsive to receiving the transition of the true input signal, the third recover signal being coupled to the first dynamic stage of the on path of the down control circuit, the first dynamic stage of the on path of the down control circuit providing the corresponding first pulse signal having a second edge responsive to receiving the third recover signal; and a fourth delay circuit generating a fourth recover signal having an edge delayed from a transition of the third recover signal responsive to receiving the transition of the third recover signal, the fourth recover signal being coupled to the second dynamic stage of the on path of the down control circuit, the second dynamic stage of the on path of the down control circuit providing the corresponding second pulse signal having a second edge responsive to receiving the fourth recover signal.

15. A buffer, as recited in claim 14, wherein the first and second delay circuits have more delay when the true input signal transitions from low to high than when the true input signal transitions from high to low; and the third and fourth delay circuits have more delay when the true input signal transitions from high to low than when the true input signal transitions from low to high.

16. A buffer, as recited in claim 14, wherein the first, second, third and fourth delay circuits are inverters.

17. A buffer, as recited in claim 7, wherein the on path of the pull-up control circuit has a first delay;

the off path of the pull-up control circuit has a second delay, the second delay being less than the first delay;

the on path of the pull-up control circuit has a third delay; and the off path of the pull-up control circuit has a fourth delay, the fourth delay being less than the third delay.

18. A buffer, as recited in claim 4, wherein a first one of the up and down control signals turns off one of the pull-up and pull-down circuits before a second one of the up and down control signals turns on the other of the pull-up and pull-down circuits.

19. A buffer, as recited in claim 4, wherein the static pull-up circuit is a pull-up transistor having a control terminal coupled to receive the first dynamic output control signal, a first current handling terminal coupled to a power node having a first reference voltage and a second current handling terminal; and the static pull-down circuit is a pull-down transistor having a control terminal coupled to receive the second dynamic output control signal, a first current handling terminal coupled to the second current handling terminal of the pull-up transistor, and a second current handling terminal coupled to a power node having a second reference voltage.

20. A buffer, as recited in claim 19 wherein
the pull-up transistor has a first polar type; and
the pull-down transistor has a second polar type different from the first polar type.

21. A buffer, as recited in claim 20 wherein
the first polar type is a p-channel type; and
the second polar type is an n-channel type.

22. A buffer, as recited in claim 1 wherein
the dynamic output control signals include first and second dynamic output control signals;
the dynamic circuit block includes
  a dynamic pull-up control circuit coupled to receive the first and second static input signals, the dynamic pull-up control circuit providing the first dynamic output control signal having a first value if the static input signals are in a first state, the first dynamic output control signal having a second value if the static input signals are in a second state; and
  a dynamic pull-down control circuit coupled to receive the first and second static input signals, the dynamic pull-down control circuit providing the second dynamic output control signal having a first value if the static input signals are in the first state, the first dynamic output control signal having a second value if the static input signals are in a second state; and
the static output block includes
  a static pull-up circuit coupled to receive the first dynamic Output control signal; and
  a static pull-down circuit coupled to receive a second dynamic output control signal.

23. A buffer, as recited in claim 22 wherein
the dynamic pull-up control circuit includes
  an on-path circuit for driving the first dynamic output control signal to the second value when the static input control signals transition from the first state to the second state; and
  an off-path circuit for driving the first dynamic output control signal to the first value when the static input control signals transition from the second state to the first state; and
the dynamic pull-down control circuit includes
  an on-path circuit for driving the second dynamic output control signal to the first value when the static input control signals transition from the second state to the first state; and
  an off-path circuit for driving the second dynamic output control signal to the second value when the static input control signals transition from the first state to the second state.

24. A buffer, as recited in claim 22 wherein
the first static input signal has a first logic value in the first state;
the second static input signal has a second logic value in the first state;
the first static input signal has the second logic value in the second state;
the second static input signal has the first logic value in the second state;
the static pull-up circuit drives the static output signal to the second logical value responsive to receiving the second value of the first dynamic output control signal; and
the static pull-down circuit drives the static output signal to the first logical value responsive to receiving the first value of the second dynamic output control signal.

25. A buffer, as recited in claim 22 wherein
the static pull-up circuit is a PMOS transistor having a gate coupled to receive the first dynamic output control signal, a drain coupled to $V_{DD}$ and a source; and
the static pull-down circuit is an NMOS transistor having a gate coupled to receive the second dynamic output control signal, a drain coupled to the source of the PMOS transistor, and a source coupled to ground;
the first value of the first dynamic output control signal is a high logical value;
the second value of the first dynamic output control signal is a low logical value
the first value of the second dynamic output control signal is a high logical value; and
the second value of the second dynamic output control signal is a low logical value.

26. An integrated circuit chip comprising
a dynamic circuit block receiving static true and complement input signals, the dynamic circuit block providing dynamic output control signals responsive to receiving the true and complement input signals, the dynamic circuit block dynamically changing the dynamic output control signals responsive to detecting a transition of the true input signal, the dynamic circuit block not receiving a clock signal;
a static output block coupled to receive the dynamic output control signals from the dynamic circuit block, the static output stage providing a static output signal responsive to receiving the dynamic output control signals such that the static output signal has a logical value the same as a logical value of the true input signal after the dynamic circuit block dynamically changes the dynamic output control signals; and
a static input block coupled to receive the true input signal, the static input block precharging the dynamic circuit block after the dynamic circuit block dynamically changes the dynamic output control signals.

27. An integrated circuit chip, as recited in claim 26, wherein said integrated circuit chip comprises an integrated circuit microprocessor chip further comprising:
an execution engine;
an instruction processing unit coupled to the execution engine; and
a cache memory coupled to the instruction processing unit.

28. An integrated circuit chip, as recited in claim 26, wherein said integrated circuit chip comprises a memory chip, the memory chip including the dynamic circuit block, the static output block and the static input block in an output buffer.

29. An integrated circuit chip, as recited in claim 26, coupled into a computer system having a processor, a memory and a bus coupled therebetween, said integrated circuit chip including circuits of at least one of said processor and said memory.

30. A method for buffering static electronic signals in a mixed static/dynamic buffer, the method comprising:
receiving a static input signal at a first input of the buffer;
generating a dynamic control signal by a dynamic stage of the buffer, the dynamic control signal having a first edge responsive to a transition of the first static signal;
generating a static output signal by a static stage of the buffer, the static output signal being generated responsive to the first edge of the dynamic control signal;

generating a precharge signal by the buffer, the precharge signal having a first edge after a predetermined delay from the transition of the static input signal; and generating a second edge on the dynamic control signal by the dynamic stage of the buffer responsive to the first edge of the precharge signal.

31. The method of claim 30, wherein the generating the dynamic control signal comprises:

generating an up control signal by a first dynamic stage of the buffer responsive to a transition of the first static signal from low to high; and generating a down control signal by second dynamic stage of the buffer responsive to a transition of the first static signal from high to low.

32. The method of claim 30, wherein the generating the static output signal comprises:

driving the static output signal to a high value responsive to receiving a dynamic up control signal; and driving the static output signal to a low value responsive to receiving a dynamic down control signal.

* * * * *